United States Patent
Gao et al.

(10) Patent No.: US 12,106,999 B2
(45) Date of Patent: Oct. 1, 2024

(54) DECOUPLED XY PARALLEL MICRO-POSITIONING STAGE

(71) Applicant: Guangdong University of Technology, Guangdong (CN)

(72) Inventors: Jian Gao, Guangdong (CN); Wenxiu Lai, Guangdong (CN); Guocong Chen, Guangdong (CN); Lanyu Zhang, Guangdong (CN); Yachao Liu, Guangdong (CN); Yongbin Zhong, Guangdong (CN); Yuheng Luo, Guangdong (CN); Huawen Lin, Guangdong (CN)

(73) Assignee: Guangdong University of Technology, Guangzhou (CN)

( * ) Notice: Subject to any disclaimer, the term of this patent is extended or adjusted under 35 U.S.C. 154(b) by 815 days.

(21) Appl. No.: 17/229,017

(22) Filed: Apr. 13, 2021

(65) Prior Publication Data

US 2021/0233800 A1 Jul. 29, 2021

(30) Foreign Application Priority Data

Jul. 9, 2020 (CN) .......................... 202010657100.7

(51) Int. Cl.
*H01L 21/687* (2006.01)
*H01L 21/68* (2006.01)
*H01L 25/075* (2006.01)

(52) U.S. Cl.
CPC ........ *H01L 21/68764* (2013.01); *H01L 21/68* (2013.01); *H01L 21/68757* (2013.01); *H01L 25/0753* (2013.01)

(58) Field of Classification Search
CPC .............. H01L 21/68; H01L 21/68757; H01L 21/68764; G12B 5/00; G12B 1/00;
(Continued)

(56) References Cited

U.S. PATENT DOCUMENTS 7,652,409 B2   1/2010 Dixon et al.
2019/0353507 A1* 11/2019 Lou .................. H02N 2/043

FOREIGN PATENT DOCUMENTS

CN    106251909 A  * 12/2016 ............... G12B 5/00
CN    108461109 A  *  8/2018
CN    209983033 U     1/2020

OTHER PUBLICATIONS

CN 108461109—Machine Translation (Year: 2018).*
CN 106251909—Machine Translation (Year: 2016).*

* cited by examiner

*Primary Examiner* — Tyrone V Hall, Jr.
*Assistant Examiner* — Alberto Saenz

(57) ABSTRACT

A decoupled XY parallel micro-positioning stage, including a central moving platform, fixed mechanisms, bridge-type micro-displacement amplification mechanisms, a four-bar symmetrical flexible guide mechanism and a piezoelectric ceramic. Each fixed mechanism is arranged between adjacent amplification mechanisms and is symmetrical about X and Y axes centered on the moving platform. The amplification mechanism is symmetrically arranged with respect to the X and Y axes, and includes two first and second longitudinal beams and multiple crossbeams. The two first longitudinal beams are provided in parallel and spaced apart. The two second longitudinal beams are arranged spaced apart between the two first longitudinal beams, and are connected to the two first longitudinal beams via the crossbeams. The crossbeams are connected to the longitudinal beams via a flexible hinge. The piezoelectric ceramic is arranged between the two first longitudinal beams.

10 Claims, 2 Drawing Sheets

(58) Field of Classification Search
CPC ........ Y10T 29/49998; Y10T 29/53961; B23Q 1/28; B23Q 1/34; B23Q 1/48; B23Q 1/621
USPC ............................................ 269/55, 60, 666
See application file for complete search history.

DECOUPLED XY PARALLEL MICRO-POSITIONING STAGE

CROSS-REFERENCE TO RELATED APPLICATIONS

This application claims the benefit of priority from Chinese Patent Application No. 202010657100.7, filed on Jul. 9, 2020. The content of the aforementioned application, including any intervening amendments thereto, is incorporated herein by reference in its entirety.

TECHNICAL FIELD

This application relates to Micro LED repairing, and more particularly to a decoupled XY parallel micro-positioning stage.

BACKGROUND

With the rapid development of the information technology, various electronic products have been widely applied in daily life and industrial production. As a new display technology, micro light emitting diode (Micro LED) has a higher brightness, better luminous efficiency, lower power consumption, smaller size, higher resolution and longer service life than the existing organic light emitting diode (OLED), and thus it has a more promising prospect. Nowadays, though a great progress has been made in the mass transfer and mount technology of Micro LED chips, the chip repairing technology, which plays an indispensable role in improving the efficiency and reliability of the Micro LED production, still needs to be improved.

Chinese patent No. 209983033U discloses an apparatus for detecting, repairing and mounting Micro LED chips, in which a movable shaft is driven by a linear motor to position the Micro LED chip. However, considering the small size (almost 1-10 μm) of the Micro LED chips, there are great difficulties in accurately positioning the chip based on such structure.

Therefore, there is an urgent need to improve the existing Micro LED repair technology to meet the increasing technological requirements.

SUMMARY

An aim of the present disclosure is to provide a decoupled XY parallel micro-positioning stage for the repairing of micro light emitting diode (Micro LED), to overcome the defect in the prior art that it is difficult to achieve the precise and fast positioning during the repair process of Micro LED.

In order to achieve the above-mentioned object, the present disclosure provides a decoupled XY parallel micro-positioning stage, comprising:
a central moving platform;
a plurality of fixed mechanisms;
a plurality of bridge-type micro-displacement amplification mechanisms;
a plurality of four-bar symmetrical flexible guide mechanisms; and
a piezoelectric ceramic;
wherein the plurality of bridge-type micro-displacement amplification mechanisms are symmetrically arranged with respect to an X axis and a Y axis centered on the central moving platform;
each of the plurality of fixed mechanisms is arranged between adjacent bridge-type micro-displacement amplification mechanisms; and the plurality of fixed mechanisms are symmetrically arranged with respect to the X axis and/or the Y axis centered on the central moving platform; each of the plurality of bridge-type micro-displacement amplification mechanisms comprises two first longitudinal beams, two second longitudinal beams and a plurality of crossbeams;
the two first longitudinal beams are provided in parallel and spaced apart;
two second longitudinal beams are arranged spaced apart between two first longitudinal beams;
the two second longitudinal beams are respectively connected to the two first longitudinal beams via the plurality of crossbeams;
the plurality of crossbeams are respectively connected to the two first longitudinal beams and the two second longitudinal beams via a flexible hinge;
the piezoelectric ceramic is arranged between the two first longitudinal beams, and is connected to the two first longitudinal beams as an input end of the central moving platform;
an output end is provided on a second longitudinal beam of the two second longitudinal beams that is close to the central moving platform; and
the output end is connected to the central moving platform and the plurality of fixed mechanisms respectively via the plurality of four-bar symmetrical flexible guide mechanisms.

In some embodiments, crossbeams connected between one of the two first longitudinal beams and the two second longitudinal beams, and crossbeams connected between the other of the two first longitudinal beams and the two second longitudinal beams, are the same in number; and the plurality of crossbeams are provided in parallel.

In some embodiments, each of the plurality of micro-displacement amplification mechanisms comprises eight crossbeams, two first longitudinal beams and two second longitudinal beams; and two crossbeams are provided between each of the two second longitudinal beams and each of the two first longitudinal beams.

In some embodiments, the flexible hinge is a corner-filleted V-shaped flexible hinge.

In some embodiments, a top end of the corner-filleted V-shaped flexible hinge is a rounded corner;
a radius of the rounded corner of the corner-filleted V-shaped flexible hinge is ⅛ of a total length of the corner-filleted V-shaped flexible hinge; and
the rounded corner of the corner-filleted V-shaped flexible hinge has an angle of π/4

In some embodiments, the plurality of four-bar symmetrical flexible guide mechanisms are spliced by multiple S-shaped hinges.

In some embodiments, each of the plurality of fixed mechanisms is a right-angle fixed mechanism.

In some embodiments, the number of the plurality of bridge-type micro-displacement amplification mechanisms is four; and the number of the plurality of the fixed mechanisms is four.

In some embodiments, an end of the right-angle fixed mechanism is provided with a first connecting hole for fixing;
the central moving platform is provided with a plurality of second connecting holes for fixing; and
the one of the two second longitudinal beams away from the central moving platform is provided with a third connecting hole for fixing.

In some embodiments, the central moving platform is made of 7075 aluminum alloy.

Compared to the prior art, this application has the following beneficial effects.

In this disclosure, a plurality of bridge-type micro-displacement amplification mechanisms are symmetrically arranged with respect to an X axis and a Y axis centered on a central moving platform. Compared to other amplification mechanisms such as lever mechanisms, the bridge-type micro-displacement amplification mechanism has higher lateral stiffness and can provide a high-speed response to input displacement without distortion. In addition, the bridge-type micro-displacement amplification mechanism also plays a role of decoupling and guiding in the motion platform, and can effectively amplify the micro-displacement of a piezoelectric ceramic and achieve the accurate positioning during the repair process. The flexible hinge eliminates the idling and mechanical friction in the transmission process by means of the small deformation and self-recovery characteristic of the elastic material, enabling the frictionless and gapless transmission of micromotion. The overall structure is designed to be mirror-symmetrical, which effectively balances the internal stress of the system and improves the rigid and load-bearing characteristics of the central moving platform, facilitating eliminating the lateral additional displacement and reducing the longitudinal coupling displacement error of the mechanism itself on the premise that the mechanism is accurately designed in size. At the same time, the natural frequency and bandwidth of the mechanism are relatively large, which facilitates a stable operation of the mechanism.

BRIEF DESCRIPTION OF THE DRAWINGS

The disclosure will be described in detail below with reference to the accompanying drawings to make the technical solutions of the present disclosure clearer. Obviously, presented in the drawings are merely some embodiments of this disclosure, and are not intended to limit the disclosure. Other drawings obtained by those skilled in the art based on the content disclosed herein without sparing any creative effort shall fall within the scope of the present disclosure.

Figure 1:
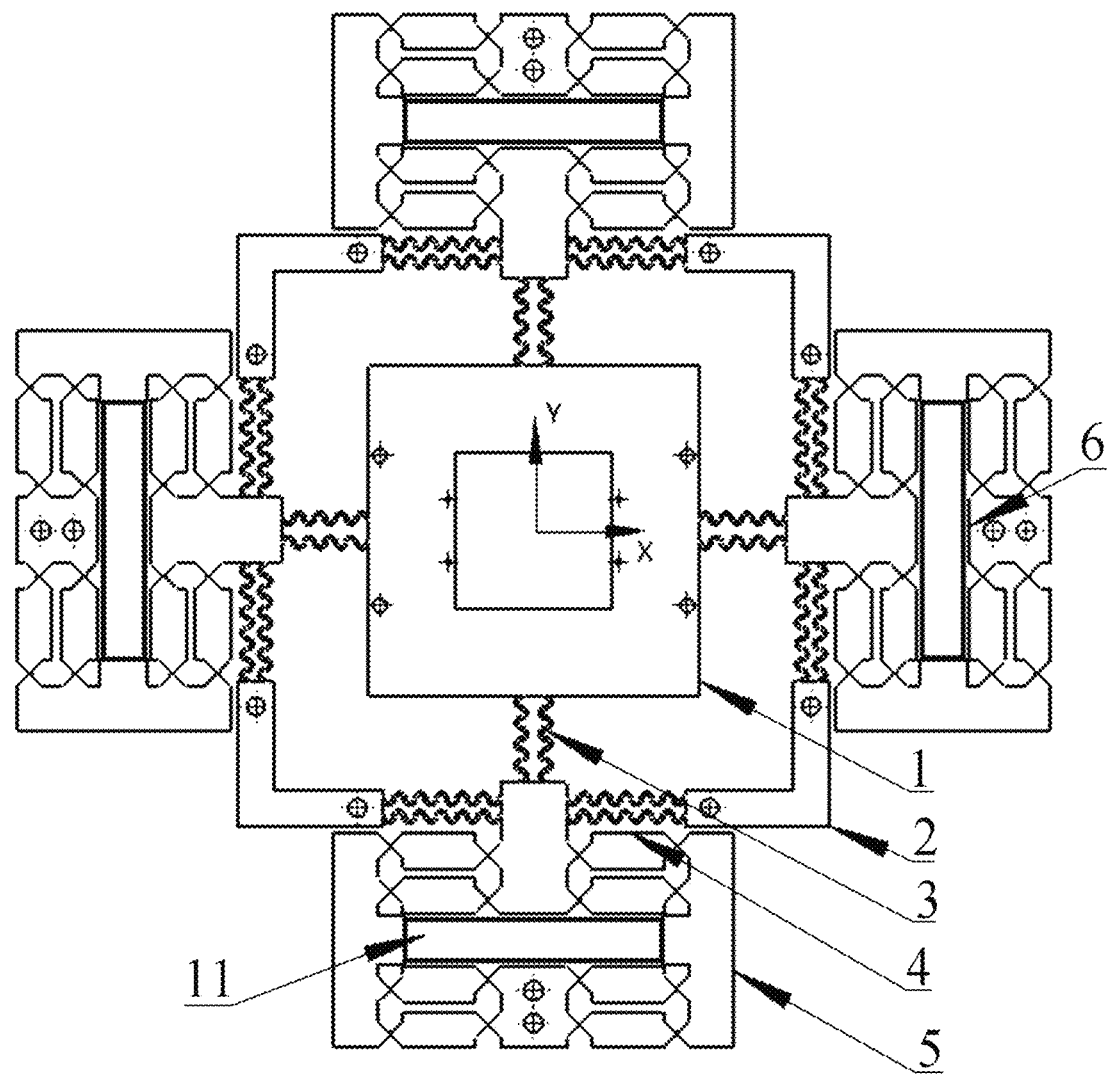
FIG. 1 schematically depicts a structure of a decoupled XY parallel micro-positioning stage in accordance with an embodiment of the present disclosure.

In the drawings, 1, central moving platform; 2, fixed mechanism; 3, four-bar symmetrical flexible guide mechanism; 4, crossbeam; 5, first longitudinal beam; 6, bridge-type micro-displacement amplification mechanism; 7, second longitudinal beam; 8, output end; 9, input end; 10, flexible hinge; and 11, piezoelectric ceramic.

DETAILED DESCRIPTION OF EMBODIMENTS

The technical solutions of this disclosure will be clearly and completely described below with reference to the accompanying drawings and embodiments. Obviously, the embodiments described herein are illustrative of the disclosure, and are not intended to limit the present disclosure. Other embodiments made by those skilled in the art based on the content disclosed herein without sparing any creative effort should fall within the scope the present disclosure.

As used herein, the orientation or position terms, such as "center", "upper", "lower", "left", "right", "vertical", "horizontal", "inner" and "outer", are intended to illustrate the orientation or positional relationship shown in the drawings. These terms are merely illustrative of this disclosure, and do not indicate or imply that the device or element referred to must have the specified orientation, or must be constructed and operated in the specified orientation. Therefore, these terms should not be interpreted as a limitation to this disclosure. In addition, the terms "first", "second" and "third" are only used for description, and should not be understood to indicate or imply the relative importance.

As used herein, it should be noted that unless otherwise specified, the terms "install", "connect" and "link" should be understood in a broad sense. For example, it can be interpreted as fixed connection, replaceable connection or integral connection, or can be interpreted as mechanical connection or electrical connection, or can be interpreted as direct connection or indirect connection through an intermediate medium, or can be interpreted as communication between two elements. For those skilled in the art, the specific meanings of the above terms can be understood according to the corresponding description.

The present disclosure discloses a large-stroke, high-speed and high-precision decoupled XY parallel micro-positioning stage.

Embodiment 1

Figure 2:
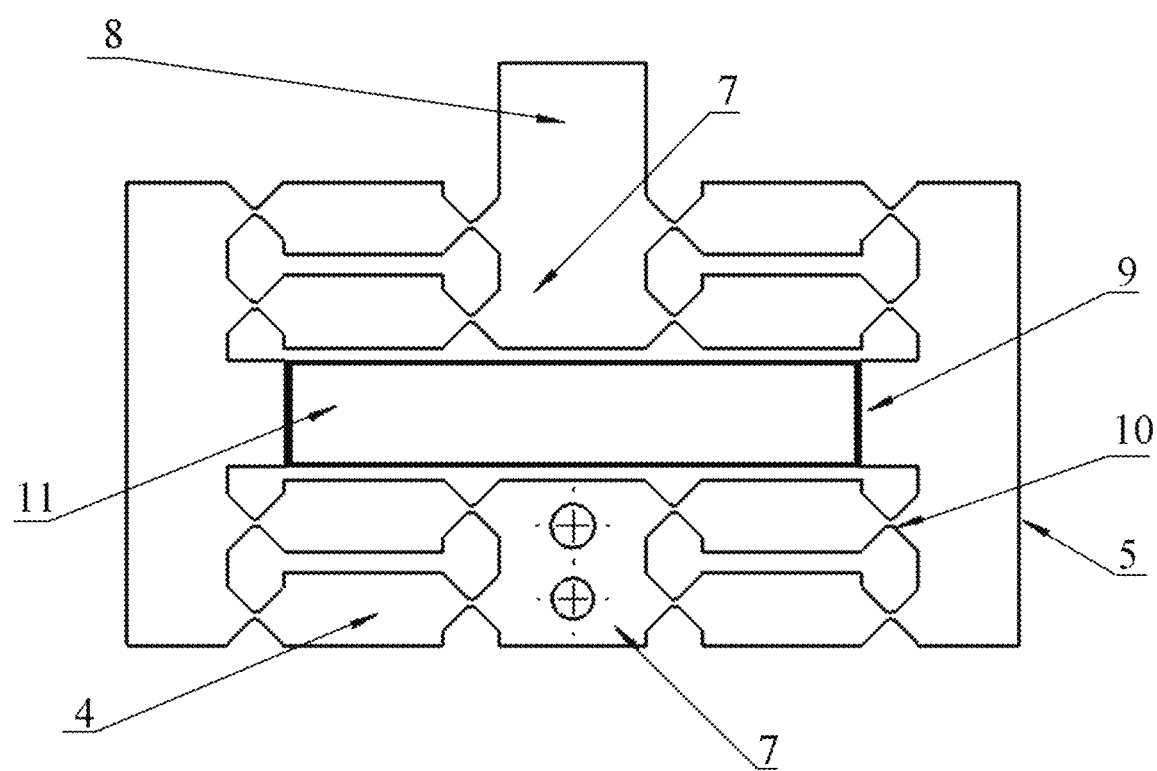
FIG. 2 schematically depicts a structure of a bridge-type micro-displacement amplification mechanism.

As shown in FIGS. 1-2, a large-stoke, high-speed and high-precision decoupled XY parallel micro-positioning stage is provided, which includes a central moving platform 1, a plurality of fixed mechanisms 2, a plurality of bridge-type micro-displacement amplification mechanisms 6, a plurality of four-bar symmetrical flexible guide mechanisms 3 and a piezoelectric ceramic 11. The plurality of bridge-type micro-displacement amplification mechanisms 6 are symmetrically arranged with respect to an X axis and a Y axis centered on the central moving platform 1. Each of the plurality of fixed mechanisms 2 is arranged between the adjacent bridge-type micro-displacement amplification mechanisms 6. The plurality of fixed mechanisms 2 are symmetrically arranged with respect to the X axis and/or the Y axis centered on the central moving platform 1. The bridge-type micro-displacement amplification mechanism 6 is a composite bridge-type amplifying mechanism, which is composed of two bridge-type displacement amplification mechanisms in parallel. The bridge-type micro-displacement amplification mechanism 6 includes two first longitudinal beams 5, two second longitudinal beams 7 and a plurality of crossbeams 4. The two first longitudinal beams 5 are provided in parallel and spaced apart. Two second longitudinal beams 7 are arranged spaced apart between two first longitudinal beams 5. The two second longitudinal beams 7 are respectively connected to the two first longitudinal beams 5 via the plurality of crossbeams 4. The plurality of crossbeams 4 are respectively connected to the two first longitudinal beams 5 and the two second longitudinal beams 7 via a flexible hinge 10. An input end 9 is provided on a middle of each of the two first longitudinal beams 5. The piezoelectric ceramic 11 is arranged between the two first longitudinal beams 5, and is connected to the input ends 9 of the two first longitudinal beams 5, respectively. An output end 8 is provided on the second longitudinal beam 7 close to the central moving platform 1. The output end 8 is connected to the central moving platform 1 and the fixed mechanisms 2 respectively via the plurality of four-bar symmetrical flexible guide mechanisms 3.

In some embodiments, the flexible hinge 10 is a straight beam hinge, a semicircular hinge or a parabolic flexible hinge, so that the flexible hinge can be elastically rotated and deformed.

In the schematic diagram of this embodiment, the piezoelectric ceramic 11 is arranged is arranged in the middle of the two second longitudinal beams 7 and does not contact the second longitudinal beam 7. The piezoelectric ceramic tail is fixed on the first longitudinal beam 5 by the hexagon socket bolts, and the head contact with another first longitudinal beam to achieve a certain pre-tightening force fit.

Compared to other amplification mechanisms such as lever mechanisms, the bridge-type micro-displacement amplification mechanism 6 has compact structure and small space occupation, and the input displacement is not prone to distortion. Moreover, the composite bridge amplification mechanism inherently has higher stiffness.

Embodiment 2

As shown in FIGS. 1-2, a large-stoke, high-speed and high-precision decoupled XY parallel micro-positioning stage is provided, which includes a central moving platform 1, a plurality of fixed mechanisms 2, a plurality of bridge-type micro-displacement amplification mechanisms 6, a plurality of four-bar symmetrical flexible guide mechanisms 3 and a piezoelectric ceramic 11. The plurality of bridge-type micro-displacement amplification mechanisms 6 are symmetrically arranged with respect to in an X-axis direction and a Y-axis direction with the central moving platform 1 as a center. Each of the plurality of fixed mechanisms 2 is arranged between the adjacent bridge-type micro-displacement amplification mechanisms 6. The plurality of fixed mechanisms 2 are symmetrically arranged in the X-axis direction and/or the Y-axis direction with the central moving platform 1 as the center. The bridge-type micro-displacement amplification mechanism 6 is a composite bridge-type amplifying mechanism, which is composed of two bridge-type displacement amplification mechanisms in parallel. The bridge-type micro-displacement amplification mechanism 6 includes two first longitudinal beams 5, two second longitudinal beams 7 and a plurality of crossbeams 4. The two first longitudinal beams 5 are parallel and spaced apart. The two second longitudinal beams 7 are arranged between the two first longitudinal beams 5 and are spaced apart in a direction facing the central moving platform 1. The two second longitudinal beams 7 are respectively connected to the two first longitudinal beams 5 via the crossbeams 4. The crossbeams 4 are respectively connected to the two first longitudinal beams 5 and the two second longitudinal beams 7 via a flexible hinge 10. An input end 9 is provided on a middle of the two first longitudinal beams 5. The piezoelectric ceramic 11 is arranged between the two first longitudinal beams 5, and is connected to the input ends 9 on the two first longitudinal beams 5, respectively. An output end 8 is provided on the second longitudinal beam 7 close to the central moving platform 1. The output end 8 is connected to the central moving platform 1 and the fixed mechanisms 2 respectively via the four-bar symmetrical flexible guide mechanisms 3.

In some embodiments, crossbeams 4 connected between one of the two first longitudinal beams 5 and the two second longitudinal beams 7 and crossbeams 4 connected between the other of the two first longitudinal beams 5 and the two second longitudinal beams 7 have the same number, and the plurality crossbeams are provided in parallel.

In some embodiment, each of the micro-displacement amplification mechanisms 6 includes eight crossbeams 4, sixteen flexible hinges 10, two first longitudinal beams 5 and two second longitudinal beams 7.

Two crossbeams 4 are provided between each of the two second longitudinal beams 7 and each of the two first longitudinal beams 5.

In some embodiments, the flexible hinge 10 is a corner-filleted V-shaped flexible hinge, so as to have higher rigidity. A top end of the corner-filleted V-shaped flexible hinge is a rounded corner. A radius of a rounded corner is ⅛ of the total length of the corner-filleted V-shaped flexible hinge. The rounded corner of the corner-filleted V-shaped flexible hinge has an angle of $\pi/4$.

The corner-filleted V-shaped flexible hinge that meets the above conditions has higher rigidity than other flexible hinges such as circular flexible hinges and leaf-shaped flexible hinges, so that it can quickly respond to the input signal.

In some embodiments, the four-bar flexible symmetrical guiding mechanism are spliced by S-shaped flexible hinges. Among them, the SP1 connecting the composite bridge type amplifying mechanism and the right-angle fixing mechanism has the same S-shaped bending direction, so that the composite bridge type amplifying mechanism has better linearity in the motion output. The SP2 connecting the composite bridge type amplifying mechanism and the center mobile platform has opposite S-shaped bending directions, which can reduce the displacement transmission loss to the bridge type micro-displacement amplifying mechanism 6 and also has better decoupling performance.

In some embodiments, the fixed mechanism 2 is a right-angle fixed mechanism.

The fixed mechanism 2 can also be a corner-filleted fixed mechanism or a linear fixed mechanism, so that two ends of the fixed mechanism 2 can be connected to the adjacent bridge-type micro-displacement amplification mechanism 6 and can be fixed.

In some embodiments, the number of the plurality of bridge-type micro-displacement amplification mechanisms 6 is four and the number of the plurality of the fixed mechanisms 2 is four.

In some embodiments, the bridge-type micro-displacement amplification mechanisms 6 and the fixed mechanisms 2 are symmetrically arranged with respect to the X axis and/or the Y axis with centered on the central moving platform 1. In this embodiment, four bridge-type micro-displacement amplification mechanisms 6 are provided and four fixed mechanisms 2 are provided, so that the system can position quickly and accurately during the repair process of the Micro LED chip.

In some embodiments, an end of the fixing mechanism 2 is provided with a first connecting hole for fixing, and the central moving platform 1 is provided with a plurality of second connecting holes for fixing.

In some embodiments, one of the two second longitudinal beams 7 away from the central moving platform 1 is provided with a third connecting hole for fixing.

The connecting holes described herein can be countersunk head holes or bolt holes, so that the connecting piece can be fixed. In this embodiment, two first connecting holes are provided; two second connecting holes are provided; and eight third connecting holes are provided. In practice, the number of connecting holes can also be set according to actual needs, and there is no specific limitation.

In some embodiments, the central moving platform 1 is made of 7075 aluminum alloy. The 7075 aluminum alloy has large rigidity and light weight, which can effectively improve the rigidity and bandwidth of the stage and ensure the stability of the stage in the working process, so that the platform can provide good dynamic performance.

Furthermore, the decoupled XY parallel micro-positioning stage provided herein is driven by the piezoelectric ceramic 11. According to the principle of inverse piezoelectricity, the piezoelectric ceramic 11 outputs the displacement accurately by controlling the current input. The piezoelectric ceramic 11 has compact structure, high motion resolution, large output force, high energy conversion efficiency, no mechanical loss, no magnetic field and fast response, so that the large displacement output from the platform is more precise and controllable.

During the operation of the above-mentioned large-stoke, high-speed and high-precision decoupled XY parallel micro-positioning stage, when the Micro LED chip is transferred to a repair device and a defect is roughly positioned at high-speed through the large-stoke of the macromotion platform. If a micro-displacement compensation of one degree of freedom in the Y-axis direction is required, the piezoelectric ceramic 11 will input the displacement to the input end 9. At this time, the crossbeam on a left side of the second longitudinal beam 7 close to the central moving platform 1 starts to translate and rotate counterclockwise, while the crossbeam on a right side of the second longitudinal beam 7 close to the central moving platform 1 starts to experience translation and clockwise rotation.

Simultaneously, the crossbeam on a left side of the second longitudinal beam 7 away from the central moving platform 1 translates and rotates clockwise, while the crossbeam on a right side of the second longitudinal beam 7 away from the central moving platform 1 translates and rotates counterclockwise. In this way, the output end 8 outputs a displacement toward the central moving platform 1, and then the displacement is transmitted to a micro light emitting diode (Micro LED) repair workbench connected to the central working platform 1 through the flexible sliding pair 3. As a consequence, a Micro LED chip can quickly and accurately reach a top of a defective substrate and replaces a defective red-green-blue (RGB) chip. If micro-displacement compensations in both X-axis and Y-axis directions are required, the piezoelectric ceramic 11 will drive the input end 9 of the bridge micro-displacement amplifying mechanism 6 on the X-axis and Y-axis, so as to quickly and accurately perform micro-displacement compensation in X-axis and Y-axis directions. The displacement compensation performed using the above-mentioned large-stoke, high-speed and high-precision decoupled XY parallel micro-positioning stage is micro-displacement compensation, which can provide a micro-displacement compensation to the macromotion positioning device for repairing the Micro LED defect, and accurately position the chip defect.

It should be noted that these embodiments are merely preferred embodiments, and are not intended to limit this disclosure. Although the present disclosure has been described in detail with reference to the embodiments, for those skilled in the art, some modifications or changes can still be made to the technical solutions. Any modifications, replacements and improvements made without departing from the spirit of the present disclosure should fall within the scope of the disclosure defined by the appended claims.

What is claimed is:

1. A decoupled XY parallel micro-positioning stage, comprising:
    a central moving platform;
    a plurality of fixed mechanisms;
    a plurality of micro-displacement amplification mechanisms;
    a plurality of four-bar symmetrical flexible guide mechanisms; and
    a piezoelectric ceramic;
    wherein the plurality of micro-displacement amplification mechanisms are symmetrically arranged with respect to an X axis and a Y axis centered on the central moving platform;
    each of the plurality of fixed mechanisms is arranged between adjacent micro-displacement amplification mechanisms; and the plurality of fixed mechanisms are symmetrically with respect to the X axis and/or the Y axis centered on the central moving platform;
    each of the plurality of micro-displacement amplification mechanisms comprises two first longitudinal beams, two second longitudinal beams and a plurality of crossbeams;
    the two first longitudinal beams are provided in parallel and spaced apart;
    two second longitudinal beams are arranged spaced apart between the two first longitudinal beams in a direction facing the central moving platform;
    the two second longitudinal beams are respectively connected to the two first longitudinal beams via the plurality of crossbeams;
    the plurality of crossbeams are respectively connected to the two first longitudinal beams and the two second longitudinal beams via a flexible hinge;
    the piezoelectric ceramic is arranged between the two first longitudinal beams, and is connected to input ends of the two first longitudinal beams, respectively;
    an output end is provided on a second longitudinal beam of the two second longitudinal beams that is proximate to the central moving platform; and
    the output end is connected to the central moving platform and the plurality of fixed mechanisms respectively via the plurality of four-bar symmetrical flexible guide mechanisms.

2. The decoupled XY parallel micro-positioning stage of claim 1, wherein crossbeams of the plurality of crossbeams connected between one of the two first longitudinal beams and the two second longitudinal beams and crossbeams of the plurality of crossbeams connected between an other of the two first longitudinal beams and the two second longitudinal beams are the same in number; and the plurality of crossbeams are provided in parallel.

3. The decoupled XY parallel micro-positioning stage of claim 2, wherein each of the plurality of micro-displacement amplification mechanisms comprises eight crossbeams, two first longitudinal beams and two second longitudinal beams; and
    two crossbeams of the eight crossbeams are provided between each of the two second longitudinal beams and each of the two first longitudinal beams.

4. The decoupled XY parallel micro-positioning stage of claim 1, wherein the flexible hinge is a corner-filleted V-shaped flexible hinge;
    a radius of a rounded corner of the corner-filleted V-shaped flexible hinge is ⅛ of a total length of the corner-filleted V-shaped flexible hinge; and
    the rounded corner of the corner-filleted V-shaped flexible hinge has an angle of $\pi/4$.

5. The decoupled XY parallel micro-positioning stage of claim 1, wherein the plurality of four-bar symmetrical flexible guide mechanisms are spliced by S-shaped flexible hinges.

6. The decoupled XY parallel micro-positioning stage of claim 1, wherein each of the plurality of fixed mechanisms is a right-angle fixed mechanism.

7. The decoupled XY parallel micro-positioning stage of claim 1, wherein a number of the plurality of micro-displacement amplification mechanisms is four; and a number of the plurality of fixed mechanisms is four.

8. The decoupled XY parallel micro-positioning stage of claim 1, wherein an end of each of the plurality of fixed mechanisms is provided with a first connecting hole for fixing; and the central moving platform is provided with a plurality of second connecting holes for fixing.

9. The decoupled XY parallel micro-positioning stage of claim 1, wherein at least one of the two second longitudinal beams away from the central moving platform is provided with a third connecting hole for fixing.

10. The decoupled XY parallel micro-positioning stage of claim 1, wherein the central moving platform is made of 7075 aluminum alloy.

* * * * *